(12) United States Patent
Schulz

(10) Patent No.: US 7,265,641 B2
(45) Date of Patent: Sep. 4, 2007

(54) OSCILLATOR CIRCUIT ARRANGEMENT WITH AN AUTOMATION FEEDBACK CONTROL

(75) Inventor: H.-Juergen Schulz, Wellington (NZ)

(73) Assignee: ATMEL Germany GmbH, Heilbronn (DE)

( * ) Notice: Subject to any disclaimer, the term of this patent is extended or adjusted under 35 U.S.C. 154(b) by 119 days.

(21) Appl. No.: 11/049,379

(22) Filed: Jan. 31, 2005

(65) Prior Publication Data
US 2005/0168296 A1 Aug. 4, 2005

(30) Foreign Application Priority Data
Jan. 30, 2004 (DE) .................... 10 2004 005 514

(51) Int. Cl.
*H03B 5/30* (2006.01)
(52) U.S. Cl. ................ 331/116 FE; 331/167; 331/175; 331/185; 331/186
(58) Field of Classification Search ........... 331/185, 331/186, 116 FE, 167, 175
See application file for complete search history.

(56) References Cited

U.S. PATENT DOCUMENTS
6,225,871 B1 5/2001 Chien .............. 331/117 FE

FOREIGN PATENT DOCUMENTS
DE 199 12 704 10/2000

OTHER PUBLICATIONS

Niklas Troedsson et al., "High Performance 1V 2.4GHz CMOS VCO", 0-7803-7363-402; 2002, IEEE, pp. 185 to 188.

*Primary Examiner*—Arnold Kinkead
(74) *Attorney, Agent, or Firm*—W. F. Fasse; W. G. Fasse

(57) ABSTRACT

A circuit arrangement for generating oscillations with a defined frequency includes an oscillator circuit (30, 32) for generating the oscillations and a dedamping circuit (18, 20) connected to the oscillator circuit for compensating any damping of the oscillator circuit. The dedamping or damping compensation by the dedamping circuit is accomplished with the aid of a rectifier circuit (60, 62). The dedamping circuit is a bridge circuit of CMOS field effect transistors (22, 24; 26, 28) which are controlled in their operation in closed loop fashion by respective rectifier circuit branches which are in turn connected to the oscillator circuit to provide a proportional closed loop control of the damping compensation.

19 Claims, 3 Drawing Sheets

OSCILLATOR CIRCUIT ARRANGEMENT WITH AN AUTOMATION FEEDBACK CONTROL

PRIORITY CLAIM

This application is based on and claims the priority under 35 U.S.C. §119 of German Patent Application 10 2004 005 514.9, filed on Jan. 30, 2004, the entire disclosure of which is incorporated herein by reference.

FIELD OF THE INVENTION

The invention relates to a circuit arrangement for generating oscillations with a defined frequency. The oscillator circuit is dedamped by a dedamping circuit, whereby any damping of the oscillator circuit is compensated.

BACKGROUND INFORMATION

Circuit arrangements as described above are known. Oscillators in general and high frequency oscillators in particular are generally so constructed that a damped oscillator circuit is dedamped by an external circuit arrangement referred to herein as the dedamping circuit which compensates for the damping of the generated oscillation. In the ideal case the damping compensation should be such that the oscillations with a defined frequency should not be damped at all. The defined frequency in this context is the natural frequency or resonance frequency of the oscillator circuit. The exact dedamping required for the oscillator working point, at which it oscillates at its natural frequency, cannot technically be adjusted with the required accuracy due to environmental influences and due to circuit tolerances causing variations in the circuit parameters. Thus, for practical reasons the effect of the dedamping or of the respective feedback control is permitted to be larger than necessary with due regard to appropriate reserves. Such reserves are also necessary in order to assure the starting of the oscillator circuit with certainty. The oscillation amplitude increases until saturation or limitation effects prevent a further rise. These effects keep the amplitude at a determined value.

The measures taken under the heading of the so-called self-limiting oscillator principle, however, have a detrimental effect on the phase noise, particularly when the intrinsic or no load circuit quality of the oscillator circuit is low. Optimally low values for the phase noise can be achieved if the energy supplied to the oscillator circuit is equal to the energy used up by the oscillator circuit due to its intrinsic losses. If the oscillator circuit losses are high it follows that especially much energy must be supplied and that the energy reserves to be kept available are correspondingly very high.

Generally, the current consumption of the oscillator is of secondary importance, however it may not be disregarded. The current consumption is basically higher than normal in a limiting oscillator subject to limiting effects because the energies which are required for compensating such limiting effects must also be supplied in order to overcome the limiting effects. Additionally, in connection with CMOS oscillators cross-currents in a transition range must also be taken into account. The transition range is defined as a short time duration during which both complementary transistors are conducting.

An oscillator, contrary to plain amplifiers, is a feedback controlled amplifying system. Energy derived at the output of the oscillator is amplified and returned to the input of the oscillator. If the amplification is so large that the returned energy exceeds the damping losses, the amplitude at the output of the oscillator circuit will gradually increase. This increase may, for example be limited in that any component within the respective electric circuit reaches its power limit. Such an instance is referred to as self limitation of the oscillator. An oscillation thus produced does not have, as a rule, an optimal spectral purity. Such purity is impaired due to the occurrence and the size of side band noise.

In addition to self-limiting or self-regulating oscillators there are also known externally regulated oscillators wherein the amplification is adjusted manually in such a way that the amplitude of the generated oscillation does not exhaust the power reserves of the amplifier. The resulting feedback has a larger spectral purity than in the case of a self-limiting control. Ideally, the amplification should not fluctuate.

OBJECTS OF THE INVENTION

In view of the foregoing it is an aim of the invention to achieve the following objects singly or in combination:
- to provide a circuit arrangement combining an oscillating circuit with a dedamping bridge circuit that is controlled in closed loop fashion to generate an oscillation that approximates more closely an ideal undamped oscillation and has a larger spectral purity than the above mentioned known concepts involving a self-limitation and an external regulation;
- to generate an undamped oscillation which is not adversely influenced by limitation effects;
- to generate an oscillation with an accurate frequency and with a satisfactory transient speed;
- to provide a differential closed loop feedback control voltage in such a way that side band noise is effectively reduced or suppressed;
- to generate a closed loop feedback control signal based on the AC-output voltage of the oscillator circuit, specifically to derive a DC-voltage from the oscillation and superimpose this DC-voltage on the AC-output voltage whereby the feedback control is proportional to the amplitude of the AC-voltage generated by the oscillator circuit; and
- to improve or reduce the side band noise even in oscillator circuits having a relatively small no load circuit quality.

The invention further aims to avoid or overcome the disadvantages of the prior art, and to achieve additional advantages, as apparent from the present specification. The attainment of these objects is, however, not a required limitation of the claimed invention.

SUMMARY OF THE INVENTION

The above objects have been achieved according to the invention by a circuit arrangement that combines an oscillator for generating an oscillation with a defined frequency with an external dedamping circuit including a field effect transistor bridge circuit and a rectifier circuit which compensates the damping thereby dedamping the oscillator. For this purpose the rectifier circuit generates a feedback DC-voltage that depends on the amplitude of the AC-voltage derived from the oscillation of the oscillator. More specifically, the feedback DC-voltage is superimposed on the amplitude of the AC-voltage. The field effect transistor bridge of the dedamping circuit is constructed as a CMOS-bridge circuit. The combination of these features achieves an exact dedamping or damping compensation of the oscillator circuit, whereby the latter generates an undamped oscillation which is not affected by limitation effects that can be a problem in conventional oscillators.

It is an advantage of the invention that the above beneficial effects are achieved with a simple circuit arrangement that yields satisfactory results relative to the frequency accuracy and the transient speed of the oscillator.

According to a preferred embodiment the dedamping circuit comprises a symmetric arrangement of metal oxide semiconductor field effect transistors (MOSFET) or junction field effect transistors (JFET) which are combined with the oscillator circuit in an integrated circuit arrangement. The term "symmetric arrangement" has reference primarily to the bridge circuit branches to which output terminals of the oscillator circuit are connected. The term "symmetric arrangement" also has reference to a differential generation of the superimposed DC-voltage.

The symmetry of the superimposed DC-voltage adjusts the current at the drain terminal of the transistors, thereby permitting a differential shift of the working points of the respective PMOS-and NMOS-transistors. As a result, energy can be supplied to the oscillator circuit without causing an undesirable asymmetry in the energy supplied to the oscillator circuit during the two half waves of the oscillation.

In a further preferred embodiment the bridge circuit comprises at least one, preferably two bridge circuit branches, each branch comprising a pair of MOSFET transistors which are complementary relative to each other. The bridge circuit further comprises a first and a second rectifier circuit. The first rectifier circuit controls the control gates of the transistors of the first bridge branch depending on a signal derived from a first output terminal of the oscillator circuit. The second rectifier circuit controls the control gate of the transistors of the second bridge branch depending on a signal at a second output terminal of the oscillator circuit. A pair of complementary transistors comprises, for example a PMOS-transistor and an NMOS-transistor. The letters P and N provide an indication or sign of the majority charge carriers. In this embodiment the bridge circuit may comprise a full bridge comprising two half bridges, the control of which is shifted by 180° relative to each other or the circuit arrangement may comprise a half bridge.

Due to the above outlined features, the present circuit arrangement provides a differential closed loop feedback control voltage which is effective uniformly on the working points of the respective PMOS- and NMOS-transistors. This differential closed loop control voltage effectively reduces any side band noise. Additionally, such a circuit arrangement permits varying the conductivity of each bridge branch by a DC-voltage difference between the control gates of the transistors. This DC-voltage difference is easily realized by simple circuit features. This DC-voltage difference also limits the lost cross-current or drain current which bypasses the oscillator circuit. By limiting the lost current, the current consumption of the present circuit arrangement is reduced. By controlling the transistors in response to signals derived from the outputs of the oscillator circuit the intended closed loop feedback control is realized.

Each rectifier circuit according to the invention provides a signal path between a respective output of the oscillator circuit and the control gate of the respective transistor. Thus, an AC-voltage at the output of the oscillator circuit is applied to the respective transistor control gate, whereby the conductivity of each individual transistor is changed or varied in response to the natural frequency of the oscillator circuit. Since the energy supply to the oscillator circuit is controlled through the conductivity of the transistors, a feedback of the oscillator AC-voltage to the oscillator input is achieved by an amplified feedback that is phase synchronized.

According to the invention each rectifier circuit also rectifies an AC-voltage provided at the oscillator output thereby producing a DC-voltage that is used for the closed loop feedback control. This type of control assures by simple circuit features that the feedback control is proportional to the amplitude of the AC-voltage at the oscillator output.

Further, it is preferred that the feedback control differentially shifts the working points of the complementary PMOS- and NMOS-transistors of the respective bridge branch. For this purpose the symmetric circuit generates a differential feedback control voltage which symmetrically displaces the working points of the respective PMOS- and NMOS-transistors. This feature influences the transconductance of the transistors without causing an asymmetry in the energy half waves supplied to the oscillator.

In a further preferred embodiment each rectifier circuit produces the closed loop feedback control as a DC-voltage difference between the control gates of complementary PMOS- and NMOS-transistors, thereby shifting the working points by a change in the gate-source voltages of these complementary PMOS- and NMOS-transistors. This DC-voltage difference realizes a symmetric effect on the CMOS circuit structure which causes an equal treatment of both half waves of the oscillation. Such equal treatment in turn leads to a noticeable improvement of the oscillator side band noise buy reducing this noise, particularly in oscillator circuits having a small no load circuit quality. Additionally, the circuit only takes up approximately the operating current that is required for sustaining the oscillation. Another advantage of the present circuit arrangement is seen in that periodic cross-currents conventionally occurring in CMOS circuits, are substantially reduced according to the invention by the differential DC-control voltage between the gates of the field effect transistors. Further, when the load on the oscillator circuit increases the current input of the oscillator rises respectively and the oscillator adapts itself dynamically to the changing load conditions. This feature of the invention makes it possible to additionally measure the oscillator quality through its current input.

It is further preferred that the polarity of the DC control voltage difference is so oriented that the drain or cross-currents of the respective bridge circuit branches are reduced as the oscillation amplitude increases. More specifically, as the AC-voltage at the output terminals of the oscillator increases, the drain currents and thus the amplification by the transistors decrease. This feature reduces the feedback effect and leads to a decrease of the AC-voltage, whereby a self-regulation is achieved by simple circuit features.

In the rectifier circuit according to the invention, each circuit branch has a first and a second rectifier diode. The first diode has a first anode and a first cathode. The second diode has a second anode and a second cathode. The first rectifier diode is connected between the control gate of a first transistor of the first bridge branch and a reference potential. Similarly, the second rectifier diode is connected between the control gate of the second transistor of the first bridge branch and the same reference potential. More specifically, the first anode of the first diode is connected with the second cathode of the second diode of the branch circuit to form a junction which in turn is connected to the reference potential. This arrangement results in a closed loop control circuit that has the above mentioned characteristics and can be achieved with a minimal circuit technical effort and expense. Another advantage is seen that these diodes can be integrated on a semiconductor substrate even with the oscillator circuit, thereby realizing the desired integrated circuit arrangement.

According to the invention each rectifier circuit produces the DC-voltage difference from the oscillation amplitude available at the output of the oscillator. This feature provides a closed loop control voltage which is proportional to the oscillation amplitude of the oscillator.

It is also preferred that the rectifier diodes are connected to a reference potential that is equal exactly to the mean value of the oscillation amplitude. For this purpose the anode of the first rectifier diode and the cathode of the second rectifier diode form a junction which is connected to the oscillator circuit coil, preferably at a center tap of that coil. This feature assures a complete symmetry of the feedback control and hence of the drain or cross-currents of the bridge circuits controlled by the feedback control. The result is a desired reduction of the phase noise which leads to the desired spectral purity of the generated oscillation.

By tapping the reference voltage off at the center of the oscillator coil, a reference potential is obtained that has only a mean DC-voltage value and no AC-voltage component. This feature eliminates adverse influences on the feedback control which might otherwise be produced by an AC-voltage component at this point of the closed loop control circuit. However, in an alternative embodiment the reference potential can be tapped off along the oscillator coil-outside its center, whereby it becomes possible to compensate for any non-symmetric features of the transistors.

Each rectifier circuit according to the invention further comprises a parallel circuit of a capacity C and an ohmic resistor R. This parallel circuit is connected in series with the corresponding rectifier diode on the one hand and to an output of the oscillator circuit on the other hand. This feature provides, on the one hand, by a cooperation between the respective rectifier diodes of two partial rectifier circuits, a differential closed loop control voltage, namely a DC-voltage difference, between the control gates of the complementary transistors of a bridge branch of the dedamping circuit. On the other hand, this parallel circuit provides a signal path for the AC-voltage from the oscillator to the dedamping circuit resulting in a phase correct or phase synchronized coupling. Moreover, the capacitors C substantially eliminate any AC-voltage components from the rectified signal.

BRIEF DESCRIPTION OF THE DRAWINGS

In order that the invention may be clearly understood, it will now be described in connection with example embodiments thereof, with reference to the accompanying drawings, wherein.

DETAILED DESCRIPTION OF A PREFERRED EXAMPLE EMBODIMENT AND OF THE BEST MODE OF THE INVENTION

Figure 1:
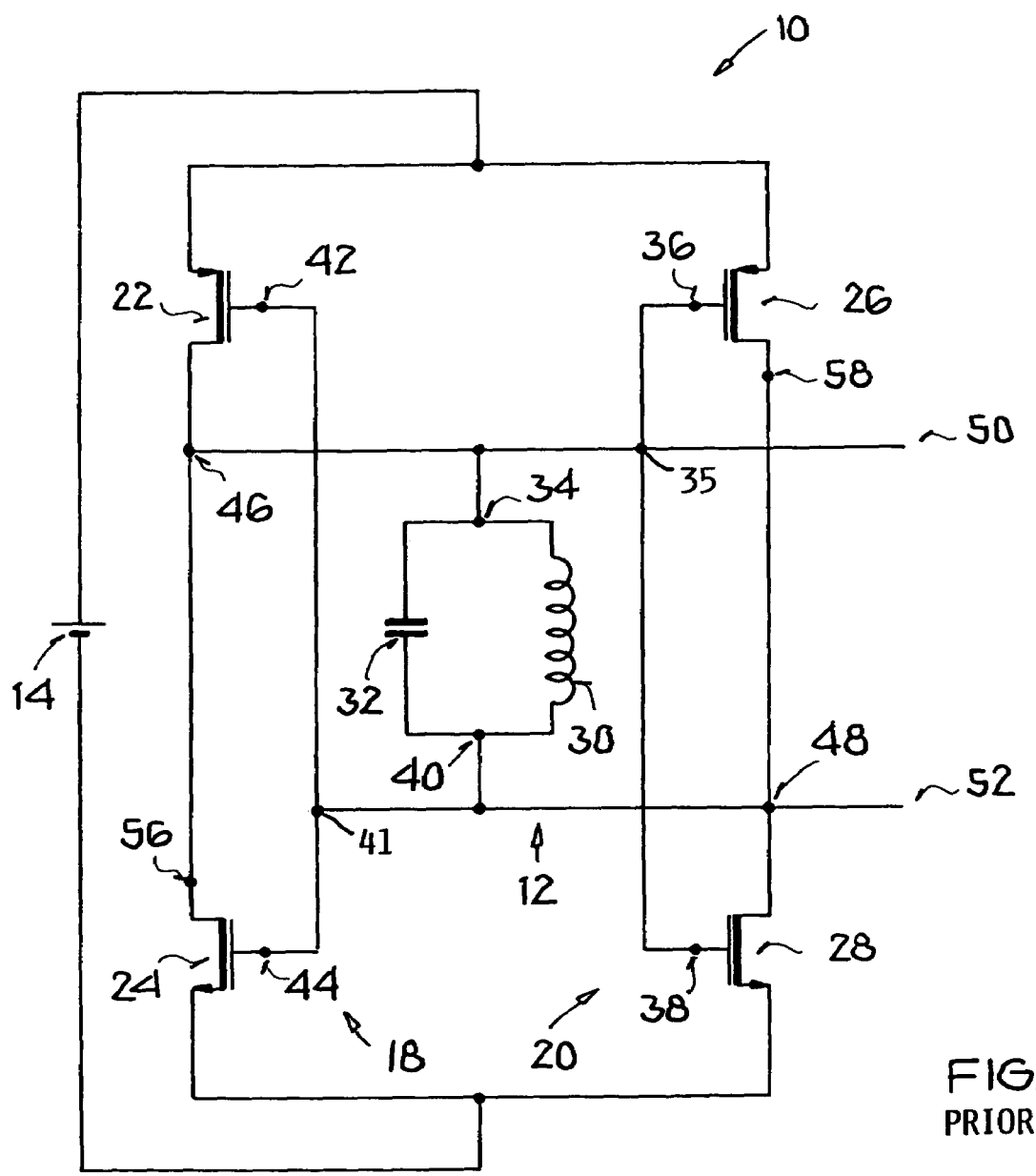
FIG. 1 shows a conventional oscillator circuit with a CMOS full bridge circuit, including field effect transistors without any automatic feedback control.

FIG. 1 shows an oscillator circuit arrangement 10 including an oscillator circuit 12 and a dedamping bridge circuit with bridge branches 18 and 20. A power source 14 supplies the circuit 10 with energy for dedamping the oscillator 12. As is frequently the case with integrated circuits, the circuit shown has a symmetric basic structure. However, the following remarks are equally applicable to asymmetric arrangements. The symmetric structure of FIG. 1 comprises a full bridge with two half bridge branches 18 and 20. The first half bridge branch 18 comprises two complementary transistors 22 and 24. The second half bridge branch 20 comprises two complementary transistors 26 and 28. The bridge circuit is constructed in accordance with CMOS technology. For example, the transistors 22 and 26 are PMOS-transistors indicated with the arrow pointing inwardly. The transistors 24 and 28 are NMOS-transistors indicated by the arrow pointing outwardly. The transistors 22 and 24 complement each other, so do the transistors 26 and 28, respectively. The transistors of each bridge branch are connected in series with each other.

The oscillator circuit 12 comprises, for example, a parallel circuit of an induction coil 30 and a capacitor 32. A first oscillator terminal 34 is connected through a circuit junction 35 to the control gates 36 and 38 of the transistors 26 and 28. A second oscillator terminal 40 is connected through a circuit junction 41 to the gates 42 and 44 of the transistors 22 and 24. Additionally, the oscillator terminal 34 is connected to a junction 46 between the two transistors 22 and 24 and to an output terminal 50. The other oscillator terminal 40 is connected to the junction 48 between the transistors 26 and 28 and to a second output terminal 52. These connections between the oscillator 12 and the bridge circuit 18, 20 constitute a symmetrical arrangement. When the power supply 14 is switched on, the oscillator 12 provides an AC-voltage at its terminals 34 and 40 and thus at the output terminals 50 and 52. Energy is supplied to the oscillator 12 through the junctions 34, 46 and 40, 48.

Initial or starting oscillation of the oscillator 12 begins due to noise and due to asymmetries in the bridge branches. When the power supply 14 is switched on and the oscillator 12 oscillates, a potential gradient is established, by the oscillation, between the first oscillator terminal 34 and the second oscillator terminal 40 with a relatively more positive potential at the terminal 34. Under this condition the transistors 24 and 26 conduct less, while the transistors 22 and 28 conduct more. As a result, the oscillator 12 is connected to a current path between the terminals of the conducting transistors 22 and 28 at the junctions 46 and 48. If the polarity at the first terminal 34 and the second terminal 40 is reversed, the transistors 22 and 28 conduct less and the oscillator 12 is connected in a current path between the terminals 56 and 58 of the transistors 24 and 26. As a result, damping losses of the oscillator 12 are initially over-compensated with a correct phase or with a phase synchronization by supplying current and thus energy from the power source 14. Thus, the amplitude of the AC-voltage of the oscillator 12 is amplified until the limitation effects inherent in the transistors prevent a further rise of the amplitude. The amplification or feedback decreases as the amplitude of the AC-voltage approximates the voltage of the supply or power supply 14. Thus, the finite value of the DC-voltage of the power supply 14 limits a further increase of the oscillator AC-amplitude.

Ideally, when the transistors of the bridge branches digitally block or conduct, current flows only through the oscillator 12. However, the circuit arrangement of FIG. 1 is realized with field effect transistors which means high cross-currents or drain currents occur in the bridge branches of the complementary transistors 22 and 24 of the first bridge branch and the complementary transistors 26 and 28 of the second bridge branch. These drain currents pass by the oscillator 12 and thus increase the loss because in reality the transistors 22, 24, 26 and 28 do not operate in digital fashion between a conducting and a non-conducting state. The switch-over rather takes place by an analog voltage that changes steadily between the terminals 34 and 40 of the oscillator 12 because the oscillator 12 generates an oscillation having a zero transition with a finite rise. In connection with the steady partially approximate square characteristic of ID as a function of UGS of the transistors 22, 24, 26, 28 an intermediate range of values of the controlling analog voltage is obtained in which both transistors 22, 24 or 26, 28 of a half bridge branch are conducting. In this intermediate range a portion of the current provided by the power source 14 bypasses the oscillator 12 and this bypass current only consumes energy, but does not contribute to the amplification in the oscillator 12. This bypass or cross-current reaches its maximum when the voltage at the two gate terminals of the two respective transistors is precisely at its middle value.

In order to influence the dedamping of the oscillator 12 by an external circuit arrangement, namely a dedamping circuit, basically different measures can be taken. For example, the no load circuit quality of the oscillator 12 can be increased, more specifically the ratio between the reactance and the effective resistance of the oscillator 12 at its resonance frequency can be increased. For this purpose the quality of the circuit components forming the resonance or oscillator 12 must be changed. Such improvement of the circuit component quality is practically not feasible because the best quality is already used in order to achieve a phase noise as low as possible. For this purpose the oscillator 12 already has an optimal component and circuit quality so that there is no room for further improvement in this direction. If all components have the same quality, the LC ratio can be increased so that the transistors work approximately as current sources, thereby providing a higher voltage and a respective increase in the amplification.

A third possibility involves influencing the transconductances of the transistors. The invention is based on this approach by using FET triode transistors. The transconductance S of a transistor in this context is the rise of the drain current ID as a function of the gate source voltage US when the drain source voltage UDS is constant. Thus, $$S = \frac{\delta I\_D}{\delta U\_GS}.$$

The transconductances of field effect transistors can be influenced by changes in their geometry. However, this geometry parameter cannot electrically be adjusted when the transistors are part of a circuit. Thus, a control of this parameter is not practically feasible. Another possibility of changing the transconductances of the field effect transistors involves influencing the drain current which in the example embodiment of the oscillator of FIG. 1 corresponds to the cross-current of the respective bridge branches. Such influence on the drain current can be achieved in the circuit by changing the operating voltage or the gate source voltage. The present invention is based on this approach, whereby the control is achieved by a DC-voltage difference between the gates of the two respective field effect transistors that are complementary to each other.

Figure 2:
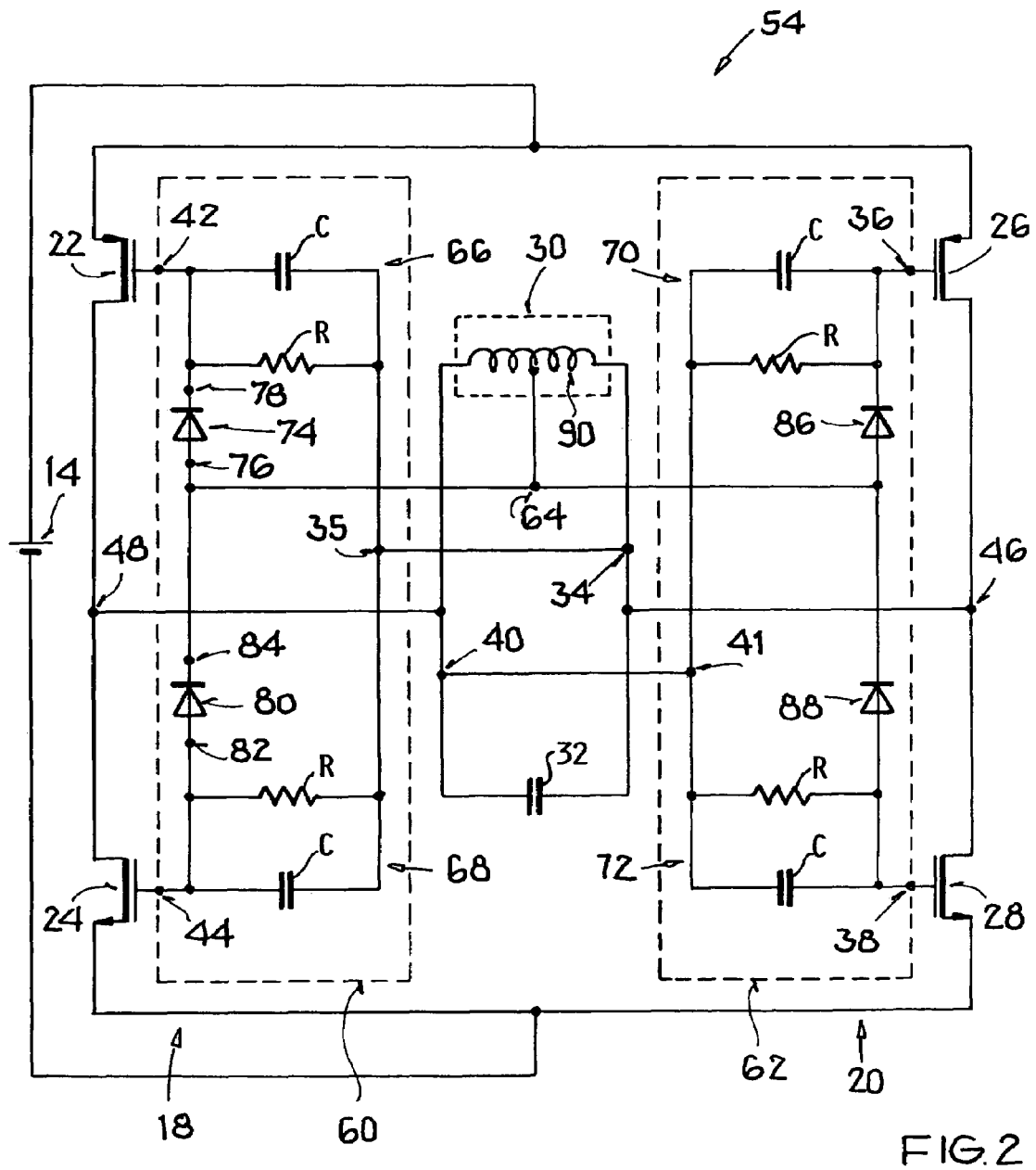
FIG. 2 shows a circuit arrangement according to the invention including an automatic feedback control.

FIG. 2 shows an example embodiment of a circuit arrangement 54 according to the invention with an automatic closed loop feedback control1 whereby the above mentioned limiting effects are avoided and current losses are reduced. The circuit of FIG. 2 distinguishes itself from the circuit of FIG. 1 by centerpoint rectifier circuits 60 and 62. The rectifier circuit or branch 60 is electrically connected between the gate terminals 42 and 44 of the first bridge branch 18 and a further tap terminal 64 of the oscillator 12. The terminal 64 is for example, but not necessarily, a centertap of the inductance coil 90 of the oscillator circuit 30, 32. The other rectifier circuit or branch 62 is electrically connected between the gate terminals 36 and 38 of the second bridge branch 20 and the tap terminal 64. The two rectifier circuits or branches 60, 62 are essential components of the automatic closed loop feedback control of the oscillator 12 according to the invention.

The present circuit arrangement 54 of FIG. 2 for generating oscillations with a defined frequency comprises an oscillator 30, 32, a dedamping circuit including two bridge circuit branches 18 and 20, a power source 14, and two rectifier circuits or branches 60 and 62 to provide an automatic closed loop feedback control for the dedamping of the oscillations. The two bridge circuit branches of the dedamping or damping compensating circuit comprise field effect transistors 22, 24, 26 and 28 which are preferably realized by MOSFET transistors arranged with the oscillator 30, 32 in an integrated circuit forming the circuit arrangement 54. Each bridge branch 18 and 20 comprises a pair 22, 24 or 26, 28 of MOSFET transistors that are complementary to each other. The first rectifier circuit 60 controls the control gates 42, 44 of the transistors 22, 24 of the first bridge branch 18 in response to an AC-voltage provided at a first output terminal 34 of the oscillator 30, 32. The second rectifier circuit 62 controls the control gates 36 and 38 of the transistors 26 and 28 of the second bridge branch 20 in response to an AC voltage provided at the second output terminal 40 of the oscillator 30, 32. For this purpose the oscillator output terminal 34 is connected to a terminal 35 of the rectifier circuit 60, thereby establishing an AC signal path from the output terminal 34 through the terminal 35 to the control gates 42 and 44 through the parallel connections of the capacitors C and the resistors R. Similarly, the output terminal 40 of the oscillator 30, 32 is connected to a terminal 41 of the second rectifier circuit 62. Thus an AC signal path is provided through respective parallel circuits of the capacitors C and the resistors R to the gate or control terminals 36, 38 of the transistors 26, 28. Each of the above mentioned AC signal oaths includes one parallel circuit of a respective resistor R with a respective capacitor C providing four parallel circuits 66, 68, 70 and 72.

In addition to providing the AC-voltage through the above described circuit paths, the rectifier circuits 60 and 62 rectify the AC-voltage generated by the oscillator 30, 32 to provide a rectified DC-voltage referred to herein as the closed loop feedback control voltage or simply as the control voltage. This control voltage symmetrically shifts the working points of the complementary PMOS-transistors and the NMOS-transistors 22, 24, 26 and 28 of the respective bridge branches 18 and 20. More specifically, the rectifier circuit 60 applies the control voltage as a DC-voltage differential between the control gates 42 and 44 of the PMOS-transistor 22 and the complementary NMOS-transistor 24. This DC-voltage differential of the control voltage shifts the working points of the complementary transistors 22, 24 by changing the respective gate source voltage. In an analog fashion the second rectifier circuit 62 produces the control voltage as a DC-voltage differential between the control gates 36 and 38 of the PMOS-transistor 26 and the complementary NMOS-transistor 28, thereby shifting the respective working points by a change in the gate source voltage of these complementary transistors 26, 28. The polarity of the DC-voltage differential is directed in such a way that cross-currents in the respective bridge branches 18 and 20 are reduced as the oscillation amplitude increases.

For generating the above mentioned control DC control voltage differential, the rectifier circuit 60 comprises a first rectifier diode 74 with a first anode 76 and a first cathode 78, as well as a second rectifier diode 80 with a second anode 82 and a second cathode 84. The diodes 74 and 80 of the first rectifier circuit 60 form a series connection with a junction between the anode 76 of the first diode 74 and the cathode 84 of the second diode 80. One end of this series connection is connected to the control gate 42 while the other end of the series connection is connected to the control gate 44. The diodes 86 and 88 form a respective series connection between the control gates 36 and 38 of the transistors 26 and 28. The junctions between the anode and cathode of the two diode pairs 76, 80 and 86, 88 are connected to a reference potential. This reference potential may be tapped off from the induction coil 90 of the oscillator 30, 32. The preferred tap 64 is in the center of the coil 90. However, any tap point along the coil may be suitable for providing the required reference potential as mentioned above.

Each rectifier circuit 60, 62 derives the DC-voltage difference or differential from the oscillation amplitude of the oscillator 30, 32. For this purpose, and as mentioned above, the rectifier diode 74, 80, 86 and 88 are connected to a reference potential which corresponds exactly to the mean value of the oscillation amplitude. Such an exact mean value is, for example achieved with the center tap 64 of the oscillation coil 90. The center tap 64 provides in a symmetric circuit arrangement exclusively a mean DC-voltage value, but not an AC-voltage component. Each parallel circuit 66, 68, 70, 72 is connected in series with one of the diodes 74, 80, 86, 88.

The mean DC-voltage generated by the oscillator 30, 32 corresponds to one half of the supply voltage of the source 14, provided that the PMOS-transistors 22 and 26, as well as the NMOS-transistors 24 and 28 have comparable characteristics. The present disclosure assumes comparable characteristics for understanding the present circuit arrangement. However, in practice there are usually manufacturing tolerances that need to be taken into account. Assuming that the power supply source 14 provides a voltage of +10V, then the drain terminals of the transistors 22, 24, 26 and 28 are held at +5V. Due to the short circuit provided for the DC-voltage by the inductance of the coil 90 of the oscillator 30, 32, the gate terminal 36, 38, 42 and 44 will also be at +5V. Assuming that the oscillators 30, 32 generate an oscillation amplitude of 4V, the terminal 34 of the oscillator 30, 32 will provide a voltage that cycles between +3V and +7V while the other terminal 40 of the oscillator 30, 32 will cycle between +7V and +3V with a precise, but opposite phase. Measuring the voltage exactly at the center of the coil 90 would yield a constant voltage of +5V.

Switching on the voltage supply source or energy source 14 causes the circuit arrangement to assume an initial state with a maximum drain current of the transistors and thus causing a maximum amplification, thereby strongly dedamping the oscillator 30, 32 and quickly starting the oscillation.

When, relative to the mean value, a negative half wave occurs at the first oscillator terminal 34, a positive half wave will occur at the second oscillator terminal 40. The negative half wave reduces the current flow through the NMOS-transistor 24 while increasing the current flow through the PMOS-transistor 22. The current flow through the first diode 74 increases while the current flow through the second diode 80 decreases. Since the diode 74 is conductive at this time, a current flows through the diode and the parallel circuit 66 generating a voltage across the parallel circuit 66. This voltage has such a polarity that it reduces the transconductance at the gate terminal 42 for the negative half wave. As a result, the current flow through the transistor 22 is increased to a lesser extent compared to a full transconductance of the negative half wave. This effect corresponds to a shifting of the working point of the transistor 22 due to a change in its gate source voltage. The transconductance effect of the negative half wave is decreased the larger the amplitude of the negative half wave is, whereby a proportional feedback control is achieved.

Since the diode 80 is blocked during the negative half wave, the transconductance effect of the negative half wave is fully effective on the control gate 44 of the NMOS-transistor 24. As a result, the above mentioned a DC-voltage difference is obtained between the control gates 42 and 44 of the transistors 22 and 24.

A positive half wave occurs at the first oscillator terminal 34 during the next half period or half wave. The positive half wave increases the current flow through the NMOS transistor 24 while reducing the current flow through the PMOS transistor 22. A current flow through the first diode 74 is reduced and a current flow through the second diode 80 is increased. Since the second diode 80 conducts, a current flows through this diode 80 and through the parallel circuit 68, thereby generating a voltage across the parallel circuit 68. This voltage has such a polarity that it reduces the transconductance effect of the positive half wave on the gate terminal 44. As a result, the current flow through the transistor 24 is increased to a lesser extent as compared to a full transconductance effect of the positive half wave. This effect also corresponds to a shifting of the working point of the transistor 24 by changing the gate source voltage of the transistor 24, whereby the transconductance effect of the positive half wave is decreased the more the larger the amplitude of the positive half wave is. The above described function of the rectifier circuit 60 applies in analogy to the second rectifier circuit 62.

The transistor 22 and the oscillator 30, 32 form with the transistor 28 a voltage divider during the first half period or half wave. As a result, the oscillator partial voltage which amplifies the oscillation, is obtained as the difference between the supply voltage provided by the source 14 and the voltage drops across the transistors 22 and 28. Correspondingly or in analogy to the foregoing the transistor 26 forms a voltage divider with the oscillator 30, 32 and the transistor 24 during a second half period or half wave. Here again the partial oscillator voltage is obtained as the difference of the supply voltage and the voltage drops at the transistors 24 and 26. Assuming that the transistors 22, 24, 26 and 28 are closed loop controllable resistors, the above described closed loop control increases the resistance of the transistors forming part of the respective voltage dividers compared to a condition without the closed loop feedback control. This resistance increase depends on the oscillation amplitude of the oscillator 30, 32 and rises with that amplitude.

More specifically, the voltage at the output of the oscillator 30, 32 is rectified and used for the closed loop control of the dedamping. The dedamping is reduced as the oscillation amplitude is rising until the amplitude and the dedamping stabilize in a point. The symmetric circuit arrangement thereby generates a differential closed loop control voltage which symmetrically shifts the working points of the respective PMOS- and PMOS-transistors. Such symmetric shifting of the transistor working points influences the transconductance of the transistors without introducing an asymmetry of the half waves in the energy supplied to the oscillator 30, 32.

Due to the exact dedamping of the oscillator 30, 32 an undamped oscillation is generated which is not subject to any limitation. Moreover, the differential effect on the CMOS-transistor structure results in an equal treatment of the two half waves which in turn results in a noticeable improvement or rather reduction of the oscillator side band noise even for oscillators having a low no load quality. Additionally, the circuit arrangement takes up only as much operating current as is necessary to sustain the oscillation. Still another advantage is seen in that the conventional high periodic cross currents or drain currents of conventional CMOS-structures are substantially reduced by the differential closed loop DC control voltage between the gates of the transistor pairs. Moreover, the current consumption increases in response to increasing loads on the oscillator circuit 54. Thus, the circuit 54 adapts itself dynamically to the instantaneous load conditions. This feature makes it possible to measure the oscillator circuit quality and the quality of the entire circuit through the current consumption.

According to the invention the DC-voltage difference is derived from the oscillation amplitude of the oscillator 30, 32 by the rectifier circuits 60, 62 which are constructed for passing the alternating voltage of the oscillator unchanged to the gates of the respective PMOS- and NMOS-transistors and for simultaneously generating, depending on the amplitude of the alternating oscillator voltage, a DC-feedback control voltage between these gates. The DC-feedback control voltage or voltage difference between the gates increases with the increasing AC-voltage. The polarity of the DC feedback control voltage influences the cross or drain currents of the respective complementary branches of the bridge circuit in such a way that with a rising oscillation amplitude the drain currents and thus the amplification or feedback is reduced. The dedamping of the oscillator is correspondingly influenced.

Figure 3:
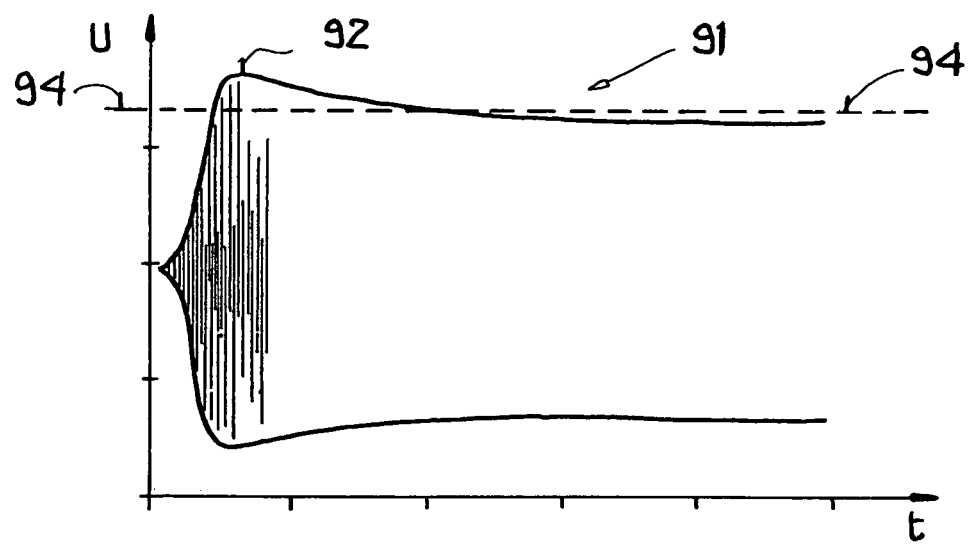
FIG. 3 shows a typical amplitude characteristic of the AC-voltage appearing at the outputs of the oscillator of FIG. 2 at the point of time when oscillation begins.

FIG. 3 shows a typical amplitude characteristic 91 of the AC-voltage U at the terminals of the oscillator 30, 32 at the time when oscillation begins. This AC-voltage is shown with random units as a function of time t. Without an additional DC-voltage difference between the gates of the transistors the amplification of the oscillator and thus the dedamping of the oscillator is initially at a maximum. This dedamping must be sufficient in order to assure a start of the oscillation under all possible circumstances and influences. The amplitude increases with time until an overshoot 92 reaches a defined value 94. This value 94 determines the side band signal to noise ratio through the reactive power generated in the oscillator. Additionally, this value 94 must prevent limiting effects.

Figure 4:
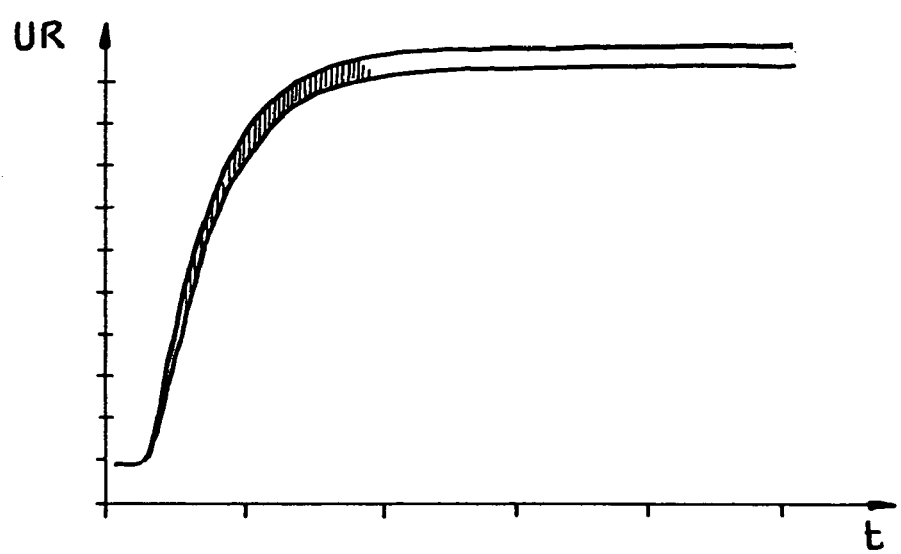
FIG. 4 illustrates a characteristic curve of the DC-voltage differential between the gates of the complementary transistors of the circuit arrangement of FIG. 2 for shifting the working points of these transistors.

FIG. 4 shows a voltage UR generated or provided between the gates of the transistors. This voltage UR is shown as a function of time. The cross current or drain current of the bridge circuit and thus the dedamping of the oscillator is reduced as the oscillator-amplitude increases. This reduction continues until the feedback and the amplitude cycle into a defined working point, which depends on stabilization processes which in turn depend on the technical circuit characteristics. This cycling into a defined working point is based on the principle of a proportional closed loop feedback control.

Figure 5:
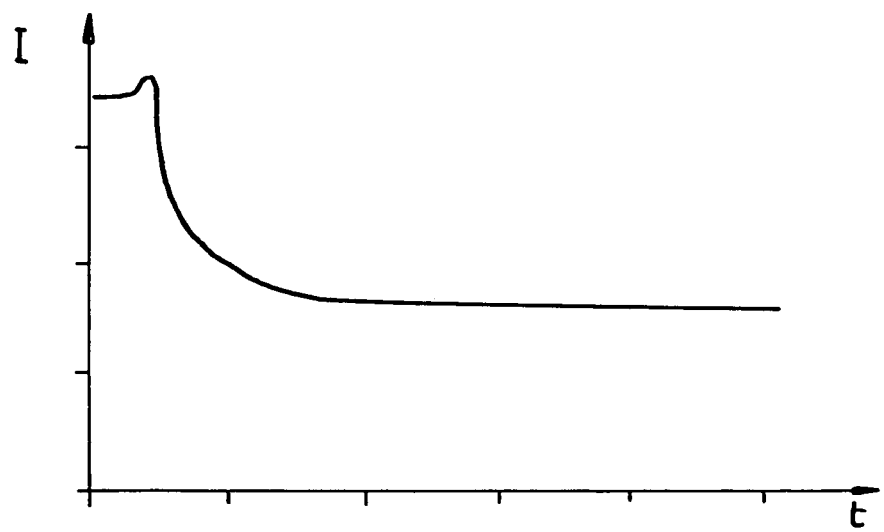
FIG. 5 illustrates the characteristic of the current supply for the circuit according to FIG. 2, at the time when oscillation starts, corresponding to FIG. 4.

FIG. 5 illustrates the mean total current consumption of the circuit arrangement 54 at the time of starting an oscillation and the resulting reduction of the cross currents I in the transistors as a function of time. The ordinate shows random current units. If the influences to which the circuit arrangement is exposed such as the operating voltage, the transistor temperature or even the quality of the oscillator, the feedback is caused to follow correspondingly, whereby the circuit 54 adapts itself dynamically to the environmental operating conditions and to the load conditions. This feature of the present circuit makes it even possible to measure the oscillator quality through its current consumption.

Generating the DC-voltage difference UR as a differential proportional feedback control is important for an effective reduction of the side band noise because this differential closed loop control voltage is effective equally on the working points of the respective PMOS- and NMOS-transistors, whereby the transconductance of the transistors is advantageously influenced without introducing an asymmetry into the energy supplied to the oscillator during the two half waves of the generated oscillation. For this purpose it has been found to be especially advantageous to connect the rectifier diodes to a reference potential that corresponds exactly to the mean value of the oscillation amplitude. The tap point 64 in FIG. 2 provides such a reference potential.

Alternatively, this reference potential can basically be produced with the aid of low pass filters at the high points of the oscillator, which, however imposes a load on the oscillator, thereby. reducing its circuit quality. Thus, it is preferred to tap this potential at the tap point 64 of the oscillator coil 90. Due to the symmetric construction of the present circuit, the tap point 64 is preferably a centertap of the oscillator coil 90 whereby this center-tap yields a mean DC-voltage value and no AC-voltage component.

Another advantage of the invention is seen in that the circuit 54 consumes only that current that is necessary for maintaining the oscillation. Still another advantage is seen in the significant reduction of the high cross- or drain currents that occur periodically in conventional CMOS structures. This reduction is achieved due to the differential DC-feedback control voltages applied to the transistor gate terminals. For this purpose the present circuit has a respective lay-out which assures that currents never flow simultaneously in both complementary transistors forming a pair in a half bridge. As a result, CMOS-oscillators according to the invention substantially improve, that is reduce noise and the energy consumption.

Ideally, an oscillator generates sinusoidal voltages that have a so-called "soft-flank" through the zero point. The present rectifier circuit produces differential DC-voltages with opposite polarities at each gate terminal of the two transistors forming a pair, whereby the transistor working points are shifted back and forth along the respective characteristic curve so that the same half wave leads to a respectively smaller voltage between the gate and source terminals of both transistors. Thus, one could say that the control voltage in FIG. 2 is somewhat reduced compared to the control voltage in the circuit of FIG. 1.

In view of the foregoing features of the invention the mean output currents produced by the transistors at the output are smaller and the amplification (di/du) is also reduced due to the quadratic characteristic curve. Additionally, the point of time when the transistors begin conducting is delayed. As a result the range of current overlap is also reduced or may even be completely eliminated. This reduction or elimination of a current flow overlap is a positive or beneficial side effect of the present circuit arrangement which leads to noticeable energy savings which increases the efficiency. The most important advantage of the invention, however, is seen in the spectral purity of the oscillation generated by the present oscillator 30, 32.

Although the invention has been described with reference to specific example embodiments, it will be appreciated that it is intended to cover all modifications and equivalents within the scope of the appended claims. It should also be understood that the present disclosure includes all possible combinations of any individual features recited in any of the appended claims.

What is claimed is:

1. A circuit arrangement for generating oscillations with a defined frequency, said circuit arrangement comprising an oscillator circuit (30, 32) for generating said oscillations and a dedamping circuit (14, 18, 20) operatively connected to said oscillator circuit (30, 32) for dedamping said oscillator circuit, said dedamping circuit comprising a dedamping bridge circuit of field effect transistors (22, 24, 26, 28) and rectifier circuits (60, 62) operatively connected to said bridge circuit and to said oscillator circuit (30, 32), wherein said dedamping bridge circuit comprises at least one first bridge branch (18), including a first pair of MOSFET transistors (22, 24) complementary to each other and at least one second bridge branch (20) including a second pair of MOSFET transistors (26, 28) complementary to one another, and wherein each of said rectifier circuits comprises a first rectifier circuit branch (60) and a second rectifier circuit branch (62), wherein said first rectifier circuit branch (60) comprises a first terminal and a second terminal connected to a respective control gate (42, 44) of said first pair of MOSFET transistors (22, 24), wherein said second rectifier ranch (62) comprises a third terminal and a fourth terminal connected to a respective control gate (36, 38) of said further pair of MOSFET transistors (26, 28), said oscillator circuit (30, 32) having a first oscillator terminal (34) connected to said first rectifier circuit branch (60), said oscillator circuit (30, 32) having a second oscillator terminal (40) connected to said second rectifier circuit branch (62), whereby said first and second rectifier circuit branches (60, 62) control said control gates in closed loop fashion in response to signals at said first and second oscillator terminals (34, 40), respectively, and wherein each of said first and second rectifier circuit branches (60, 62) comprises a first rectifier diode (74, 86) each with a first anode and a first cathode, and a second rectifier diode (80, 88) each with a second anode and a second cathode, wherein said first rectifier diode and said second rectifier diode of said first and second rectifier circuit branches (60, 62), respectively, are connected in series with each other thereby forming junctions between said first anode and said second cathode of said first and second rectifier circuit branches (60, 62), wherein said junctions are connected to a reference potential, and wherein said first cathode and said second anode are connected to a respective control gate terminal (42, 44; 36, 38) of said first and second pair of complementary MOSFET transistors (22, 24; 26, 28) forming said dedamping bridge circuit (18, 20).

2. The circuit arrangement of claim 1, wherein said at least one rectifier circuit has a proportional characteristic.

3. The circuit arrangement of claim 1, wherein said dedamping bridge circuit comprises a symmetric arrangement of said field effect transistors (22, 24, 26, 28) including any one of MOSFET and JFET transistors functioning as said field effect transistors and arranged with said oscillator circuit in a common integrated circuit.

4. The circuit arrangement of claim 1, wherein each rectifier circuit branch (60, 62) comprises a signal path (66, 68; 70, 72) connecting a respective oscillator terminal of said oscillator terminals (34, 40) to respective control gates (36, 38, 42, 44) of said field effect transistors (22, 24; 26, 28).

5. The circuit arrangement of claim 1, wherein said first and second oscillator terminals (34, 40) of said oscillator circuit (30, 32) are connected to a respective rectifier circuit branch of said first and second rectifier circuit branches (60, 62) for rectifying a respective output voltage of said oscillator circuit (30, 32) to provide a rectified closed loop control voltage for said first and second bridge branches (18, 20) of said dedamping bridge circuit.

6. The circuit arrangement of claim 5, wherein said field effect transistors comprise complementary PMOS-transistors (22, 26) complementary NMOS-transistors (24, 28), and wherein said closed loop control voltage differentially shifts working points of said complementary PMOS-transistors (22, 26) and of said complementary NMOS-transistors (24, 28) of a respective bridge branch of a said first and second bridge branches (18, 20).

7. The circuit arrangement of claim 6, wherein each of said first and second rectifier circuit branches (60, 62) produces said closed loop control voltage as a DC-voltage difference between control gates (42, 44; 36, 38) of said complementary PMOS-transistors (22, 26) and of said complementary NMOS-transistors (24, 28) thereby changing gate-source voltages of said complementary PMOS-transistors (22, 26) and of said complementary NMOS-transistors (24, 28) for shifting said workinq points.

8. The circuit arrangement of claim 7, wherein said DC-voltage difference has a polarity such that cross-currents in said first and second dedamping bridge branches (18, 20) are reduced in response to increasing amplitudes of said oscillations.

9. The circuit arrangement of claim 7, wherein said rectifier circuits (60, 62) derive said DC-voltage difference from oscillation amplitudes occurring at said output terminals (34, 40) of said oscillator circuit (30, 32).

10. The circuit arrangement of claim 1, wherein said junction (76, 84) is operatively connected to a voltage tap (64) of said oscillator circuit (30, 32) whereby said reference potential corresponds to an exact mean value of an amplitude of said oscillations of said oscillator circuit (30, 32).

11. The circuit arrangement of claim 10, wherein said oscillator circuit (30, 32) comprises an oscillator coil (90) and wherein said voltage tap (64) is connected to said oscillator coil (90) to provide said reference potential as a DC-voltage value, without any AC-component.

12. The circuit arrangement of claim 11, wherein said voltage tap (64) is connected to offcenter of said oscillator coil (90).

13. The circuit arrangement of claim 1, wherein each of said first and second rectifier circuit branches (60, 62) comprises at least one parallel circuit (66, 68; 70, 72) including an ohmic resistor (R) and a capacitor (C) connected in parallel with each other, and wherein each parallel circuit is connected in series with a respective diode (74, 80; 86, 88) of said first and second rectifier circuit branches (60, 62).

14. The circuit arrangement of claim 1, wherein said junctions are connected to a tap terminal (64) of said oscillator circuit (30, 32) for deriving said reference potential from said oscillator circuit.

15. A circuit arrangement for generating oscillations with a defined frequency, said circuit arrangement comprising an oscillator circuit (30, 32) for generating said oscillations and a dedamping circuit (14, 18, 20) operatively connected to said oscillator circuit (30, 32) for dedamping said oscillator circuit, said dedamping circuit comprising a dedamping bridge circuit of field effect transistors (22, 24, 26, 28) and rectifier circuits (60, 62) operatively connected to said bridge circuit and to said oscillator circuit (30, 32), wherein said dedamping bridge circuit comprises at least one first bridge branch (18), including a first pair of MOSFET transistors (22, 24) complementary to each other and at least one second bridge branch (20) including a second pair of MOSFET transistors (26, 28) complementary to one another, and wherein each of said rectifier circuits comprises a first rectifier circuit branch (60) and a second rectifier circuit branch (62), wherein said first rectifier circuit branch (60) comprises a first terminal and a second terminal connected to a respective control gate (42, 44) of said first pair of MOSFET transistors (22, 24), wherein said second rectifier branch (62) comprises a third terminal and a fourth terminal connected to a respective control gate (36, 38) of said further pair of MOSFET transistors (26, 28), said oscillator circuit (30, 32) having a first oscillator terminal (34) connected to said first rectifier circuit branch (60), said oscillator circuit (30, 32) having a second oscillator terminal (40) connected to said second rectifier circuit branch (62), whereby said first and second rectifier circuit branches (60, 62) control said control gates in closed loop fashion in response to signals at said first and second oscillator terminals (34, 40), respectively, and wherein each of said first and second rectifier circuit branches (60, 62) comprises at least one parallel circuit (66, 68; 70, 72) including an ohmic resistor (R) and a capacitor (C) connected in parallel with each other, and wherein each parallel circuit is connected in series with a respective diode (74, 80; 86, 88) of said first and second rectifier circuit branches (60, 62).

16. The circuit arrangement of claim 15, wherein said first and second rectifier circuit branches (60, 62) are connected to a tap (64) of said oscillator circuit (30, 32) for deriving a reference potential from said oscillator circuit.

17. A circuit arrangement for generating oscillations with a defined frequency, said circuit arrangement comprising an oscillator circuit (30, 32) for generating said oscillations and a dedamping circuit (14, 18, 20) operatively connected to said oscillator circuit (30, 32) for dedamping said oscillator circuit, said dedamping circuit comprising a dedamping full bridge circuit of four field effect transistors (22, 24, 26, 28) and at least four rectifiers (74, 80, 86, 88) operatively connected to said dedamping full bridge circuit and to said oscillator circuit (30, 32), wherein a first pair of rectifiers of said four rectifiers comprises two rectifiers (74, 80) connected in series with each other to form a first series connection connected in parallel to gate terminals (42, 44) of a first pair (22, 24) of said four field effect transistors, wherein a second pair of rectifiers of said four rectifiers comprises two rectifiers (86, 88) also connected in series with each other to form a second series connection connected in parallel to gate terminals (36, 38) of a second pair (26, 28) of said four field effect transistors, said first and second series connections of said first and second pairs of rectifiers having a respective junction (76) connected to a reference potential, wherein said four field effect transistors (22, 24, 26, 28) are interconnected to form first junctions for connection to a power supply (14) and to form second junctions (46, 48) connected to said oscillator circuit (30, 32), wherein said circuit arrangement further comprises four connector circuits (66, 68, 70, 72), and wherein each connector circuit connects a respective transistor gate terminal (36, 38, 42, 44) to said oscillator circuit (30, 32).

18. The circuit arrangement of claim 17, wherein each of said connector circuits comprises a parallel circuit including an ohmic resistor (R) and a capacitor (C) connected in parallel with each other and wherein each parallel circuit is connected in series with a respective diode (74, 80; 86, 88) of said first and second rectifier circuit branches (60, 62).

19. The circuit arrangement of claim 17, wherein said first and second rectifier branches (60, 62) are connected to a tap terminal (64) of said oscillating circuit (30, 32) for deriving said reference potential from said oscillator circuit (30, 32).

* * * * *

UNITED STATES PATENT AND TRADEMARK OFFICE
CERTIFICATE OF CORRECTION

PATENT NO. : 7,265,641 B2  Page 1 of 1
APPLICATION NO. : 11/049379
DATED : September 4, 2007
INVENTOR(S) : Schulz It is certified that error appears in the above-identified patent and that said Letters Patent is hereby corrected as shown below:

<u>Title page,</u>
Item [54], Title,
Line 2, replace "AUTOMATION" by --AUTOMATIC--;

<u>Column 1,</u>
Line 2, replace "AUTOMATION" by --AUTOMATIC--;

<u>Column 5,</u>
Line 27, after "oscillator" replace "coil-outside" by --coil outside--;

<u>Column 8,</u>
Line 7, after "control" replace "1" by --,--;

<u>Column 12,</u>
Line 41, after "preferable a" replace "centertap" by --center-tap--;

<u>Column 13,</u>
Line 43, replace "ranch" by --branch--;

<u>Column 14,</u>
Line 29, after "branch of", delete --a--;
Line 39, after "said" replace "workinq" by --working--;
Line 61, after "to" replace "offcenter" by --off-center--.

Signed and Sealed this

Seventeenth Day of March, 2009

JOHN DOLL
*Acting Director of the United States Patent and Trademark Office*